(12) United States Patent
Weng

(10) Patent No.: US 10,606,156 B2
(45) Date of Patent: Mar. 31, 2020

(54) ILLUMINATION SYSTEM AND PROJECTION DEVICE

(71) Applicant: Coretronic Corporation, Hsin-Chu (TW)

(72) Inventor: Yi-Hsuang Weng, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/256,989

(22) Filed: Jan. 24, 2019

(65) Prior Publication Data

US 2019/0235370 A1 Aug. 1, 2019

(30) Foreign Application Priority Data

Jan. 26, 2018 (CN) .......................... 2018 1 0077908

(51) Int. Cl.
*G03B 21/20* (2006.01)
*H01L 33/50* (2010.01)
(Continued)

(52) U.S. Cl.
CPC ........... *G03B 21/2006* (2013.01); *G02B 5/20* (2013.01); *G02B 26/008* (2013.01);
(Continued)

(58) Field of Classification Search
CPC .......................... G03B 21/204; G03B 21/208; G03B 21/2006; G03B 21/2013; G03B 21/2033; G03B 21/2053; G03B 21/2066; H01L 33/50; H01L 33/502; H01L 33/504; H01L 33/505; H01L 33/508
See application file for complete search history.

(56) References Cited

U.S. PATENT DOCUMENTS

2010/0245777 A1* 9/2010 Ogura .................. G02B 5/0215
353/38
2013/0322056 A1 12/2013 Konuma et al.
(Continued)

FOREIGN PATENT DOCUMENTS

CN 1308727 4/2007
CN 205507347 8/2016
(Continued)

OTHER PUBLICATIONS

"Office Action of Taiwan Counterpart Application," dated Apr. 16, 2019, p. 1-p. 6.

*Primary Examiner* — Sultan Chowdhury
(74) *Attorney, Agent, or Firm* — JCIPRNET

(57) ABSTRACT

An illumination system includes an excitation light source and a wavelength conversion element. The excitation light source provides an excitation beam. The wavelength conversion element has a wavelength conversion region, a reflective region, and a light transmissive region. The wavelength conversion region and the reflective region form an annular region. The light transmissive region is surrounded by the annular region, wherein the excitation beam passes through the light transmissive region of the wavelength conversion element. The illumination system of the disclosure is small in size and achieves favorable optical efficiency. A projection device including the illumination system is also provided.

29 Claims, 13 Drawing Sheets

(51) Int. Cl.
*G02B 5/20* (2006.01)
*G02B 27/09* (2006.01)
*G02B 27/10* (2006.01)
*G02B 26/00* (2006.01)

(52) U.S. Cl.
CPC ..... *G02B 27/0955* (2013.01); *G02B 27/1006* (2013.01); *G03B 21/204* (2013.01); *G03B 21/2066* (2013.01); *H01L 33/50* (2013.01)

(56) References Cited

U.S. PATENT DOCUMENTS

| | | | | |
|---|---|---|---|---|
| 2014/0247429 | A1* | 9/2014 | Ogino | H04N 9/3111 353/31 |
| 2016/0109789 | A1* | 4/2016 | Zhao | G03B 21/204 362/84 |
| 2018/0135816 | A1* | 5/2018 | Ishige | F21V 9/30 |

FOREIGN PATENT DOCUMENTS

| | | |
|---|---|---|
| CN | 107272315 | 10/2017 |
| JP | 5327529 | 10/2013 |
| TW | 201546495 | 12/2015 |

\* cited by examiner

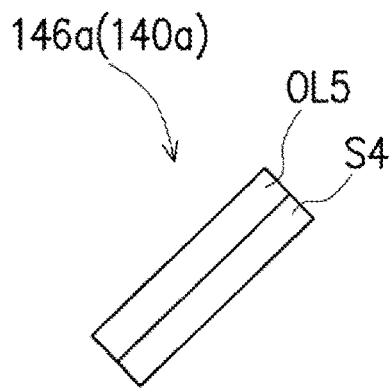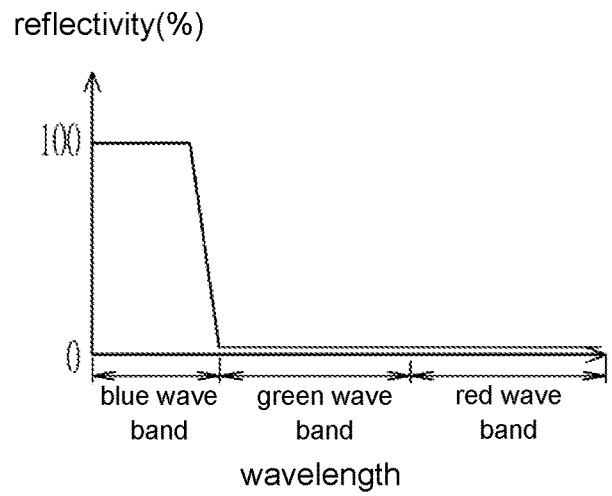
FIG. 9A  FIG. 9B
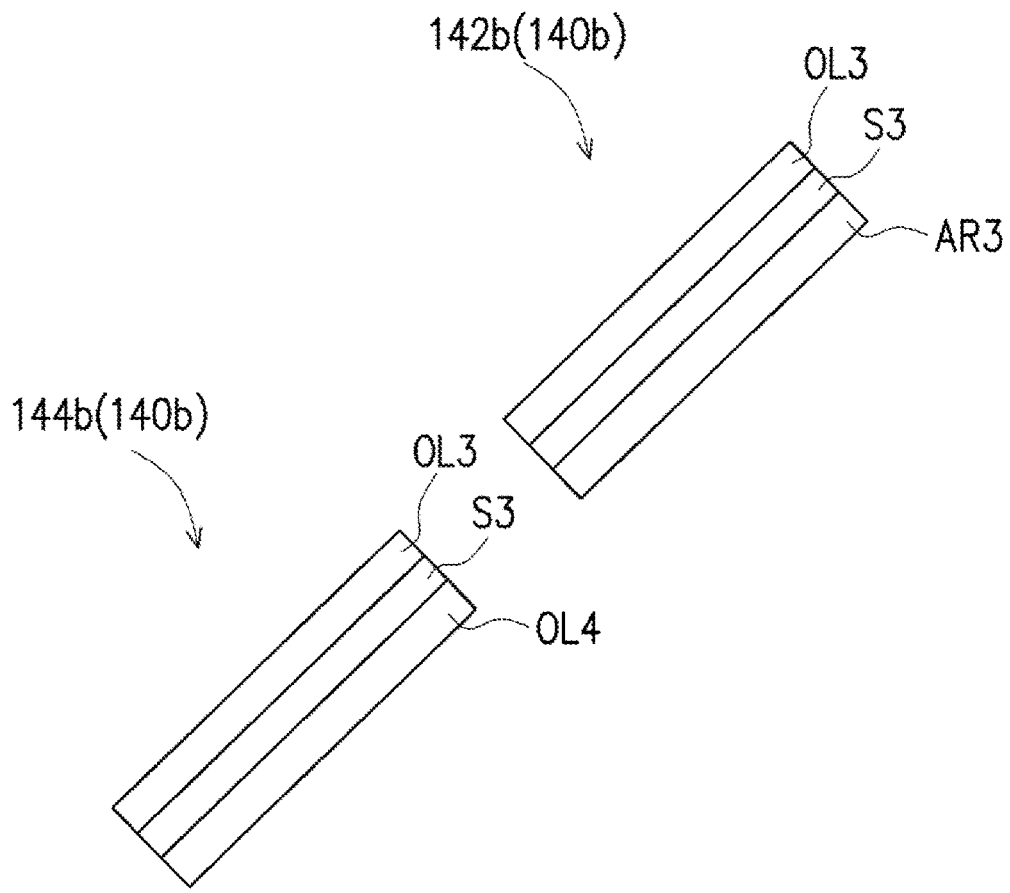
FIG. 10

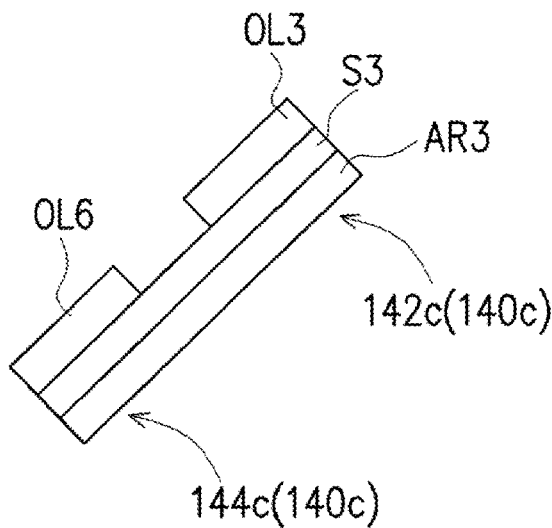
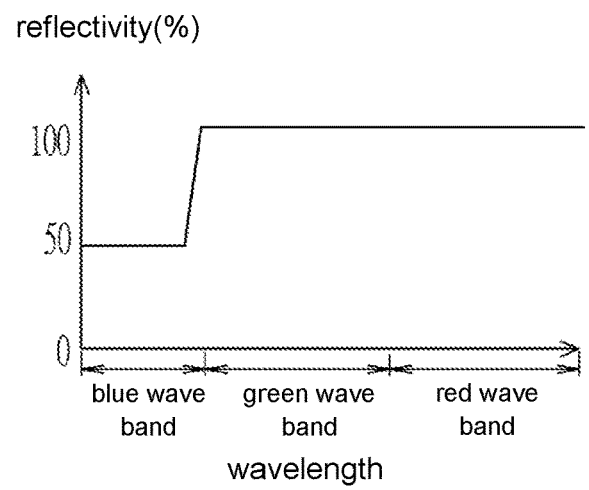
FIG. 11A  FIG. 11B
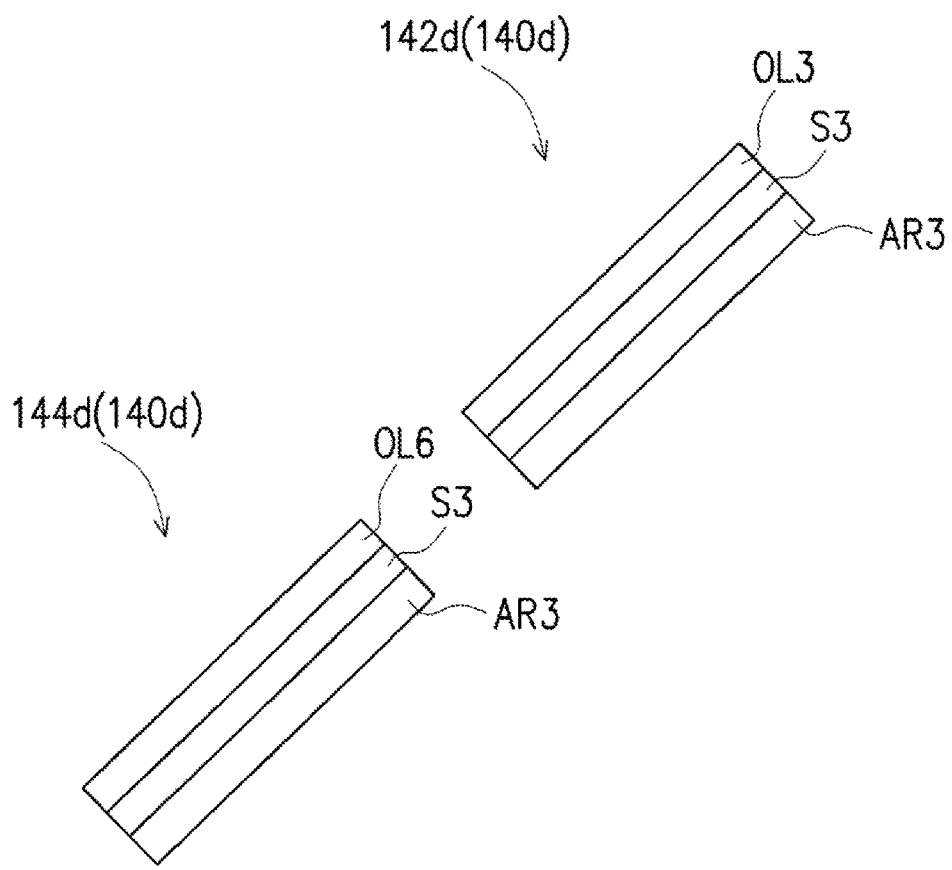
FIG. 12

ILLUMINATION SYSTEM AND PROJECTION DEVICE

CROSS-REFERENCE TO RELATED APPLICATION

This application claims the priority benefit of China application serial no. 201810077908.0, filed on Jan. 26, 2018. The entirety of the above-mentioned patent application is hereby incorporated by reference herein and made a part of this specification.

BACKGROUND

Technical Field

The disclosure relates to a projection device and more particularly relates to a projection device with an illumination system.

Description of Related Art

In the architecture of a laser projector, basically, yellow light and blue light are outputted by sequentially irradiating the phosphor of the phosphor wheel and the reflective region with a blue laser beam. When the blue laser beam reaches the phosphor of the phosphor wheel, the phosphor is excited by the blue laser beam to emit yellow light. Then, a beam splitter transmits the yellow light to a color wheel in one direction based on the characteristic of wavelength range separation. When the blue laser beam reaches the reflective region of the phosphor wheel, the blue laser beam is transmitted in another direction. Then, the blue laser beam is redirected to the color wheel by the optical elements (mirrors and lenses) and the corresponding light paths in the projector. Such a structure involves a large number of optical elements, which increases the overall size and the costs.

In order to solve this problem, one approach is to dispose a reflective element having a light splitting/combining element in the projector and use the surfaces of the reflective element and the light splitting/combining element as the reflective surface. When the blue laser beam is transmitted to the phosphor of the phosphor wheel through the light splitting/combining element, the yellow light generated by the phosphor is reflected by the reflective surface and transmitted in one direction. When the blue laser beam is transmitted to the reflective region of the phosphor wheel through the light splitting/combining element, the blue laser beam is sequentially reflected by the reflective surface and transmitted in the same direction as the yellow light. This approach may solve the aforementioned problem, but when the yellow light beam or the blue laser beam is transmitted to the reflective surface, a part of the yellow light beam or the blue light beam may be scattered to the outside through the light splitting/combining element and cause the optical efficiency to drop.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides an illumination system, which reduces the size of a projection device using the illumination system and enables the projection device using the illumination system to achieve favorable optical efficiency.

The disclosure provides an illumination system, which is small in size and achieves favorable optical efficiency.

According to an embodiment of the disclosure, an illumination system is provided, which includes an excitation light source and a wavelength conversion element. The excitation light source provides an excitation beam. The wavelength conversion element has a wavelength conversion region, a reflective region, and a light transmissive region. The wavelength conversion region and the reflective region form an annular region, and the light transmissive region is surrounded by the annular region, wherein the excitation beam passes through the light transmissive region of the wavelength conversion element.

According to an embodiment of the disclosure, a projection device is provided, which includes the aforementioned illumination system, a filter element, at least one light valve, and a projection lens. The filter element is disposed on a transmission path of a conversion beam or the excitation beam from the illumination system to form an illumination beam. The projection lens is disposed on a transmission path of an image beam.

Based on the above, in the illumination system and the projection device of the embodiments of the disclosure, since the reflective cover covers at least a part of the light transmissive region, the conversion beam or the excitation beam reflected by the reflective cover may exit via the light transmissive region and be guided by the light splitting/combining optics group to be transmitted in the same direction. Therefore, in comparison with the related art, the illumination system and the projection device of the embodiments achieve the effect of guiding the excitation beam and the conversion beam in the same direction with fewer optical elements and a smaller size.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 9A is a schematic enlarged view of a third portion.

FIG. 9B is a spectrogram of an optical layer in FIG. 9A.

FIG. 10, FIG. 11A, and FIG. 12 are schematic enlarged views of the first portion and the second portion according to different embodiments of the disclosure.

FIG. 11B is a spectrogram of an optical layer of the second portion in FIG. 11A.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
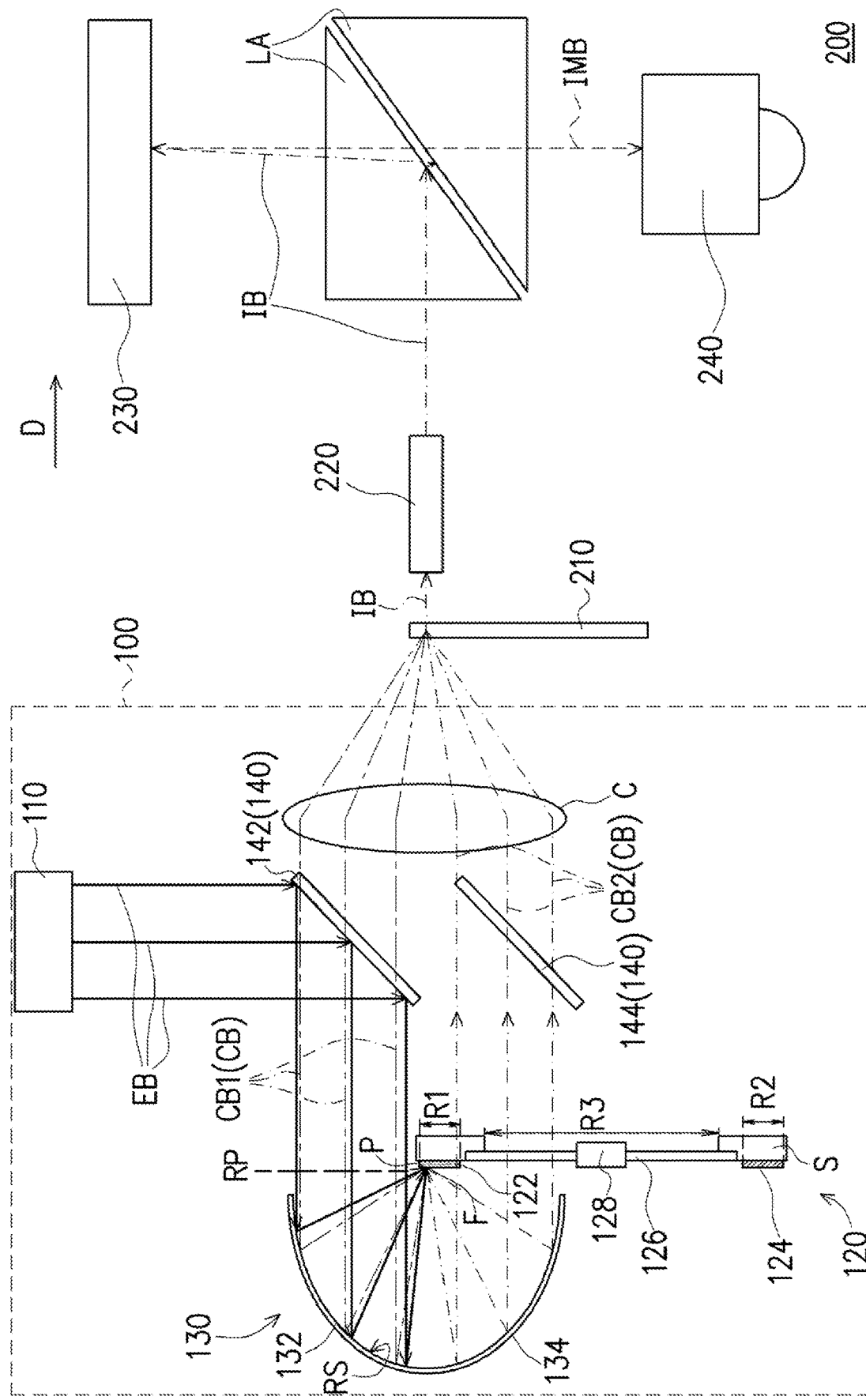
FIG. 1A is a schematic diagram of a light path of a projection device during a first time period according to an embodiment of the disclosure.
Figure 1B:
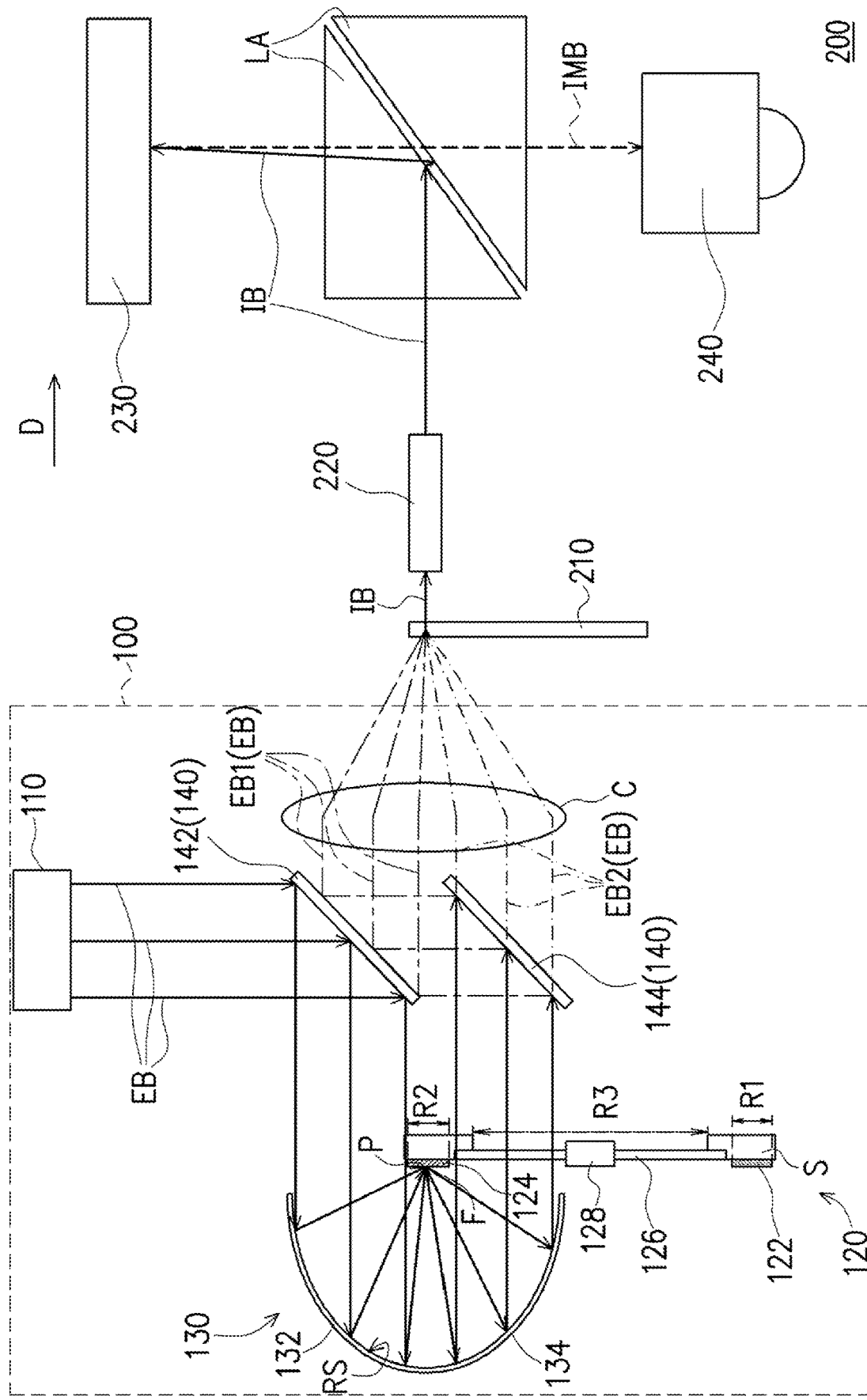
FIG. 1B is a schematic diagram of a light path of the projection device in FIG. 1A during a second time period.
Figure 2:
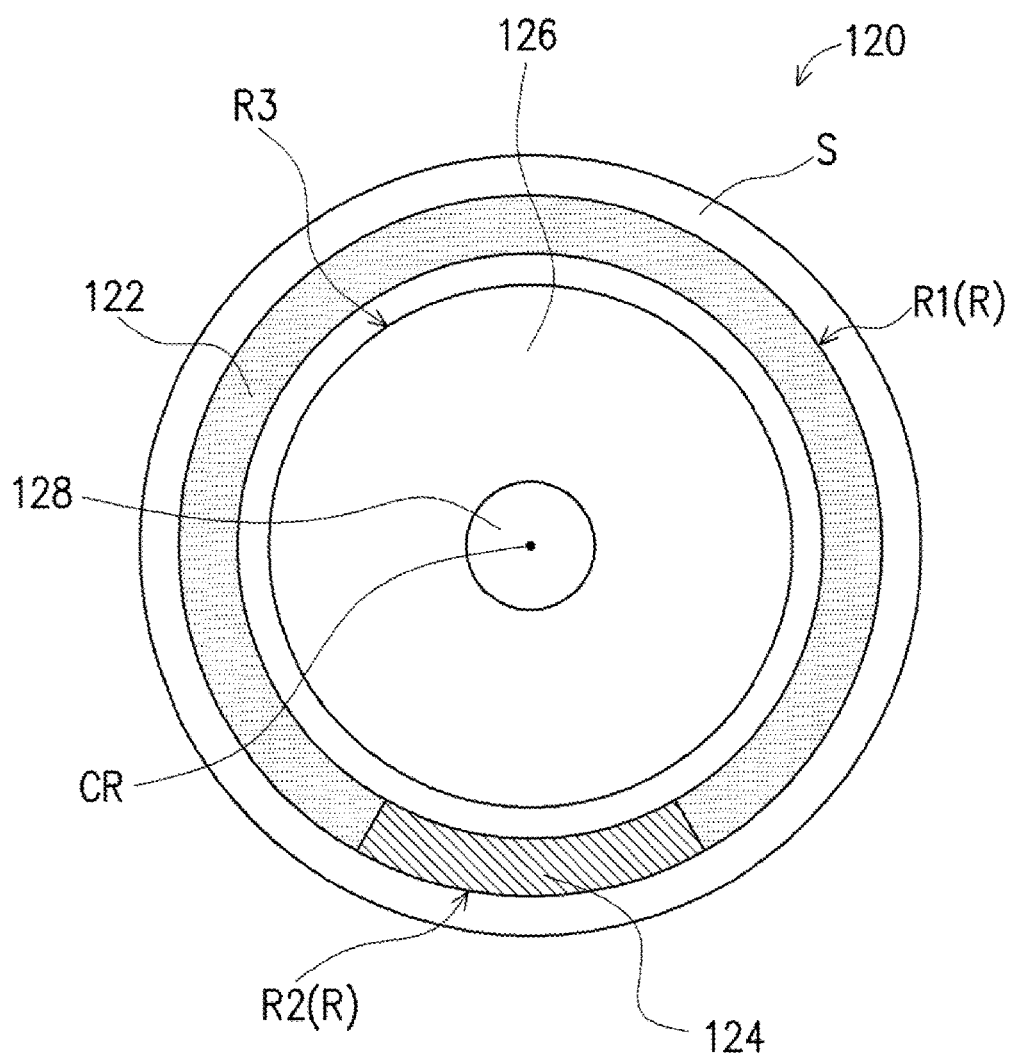
FIG. 2 is a schematic front view of a wavelength conversion element in FIG. 1A and FIG. 1B.
Figure 3:
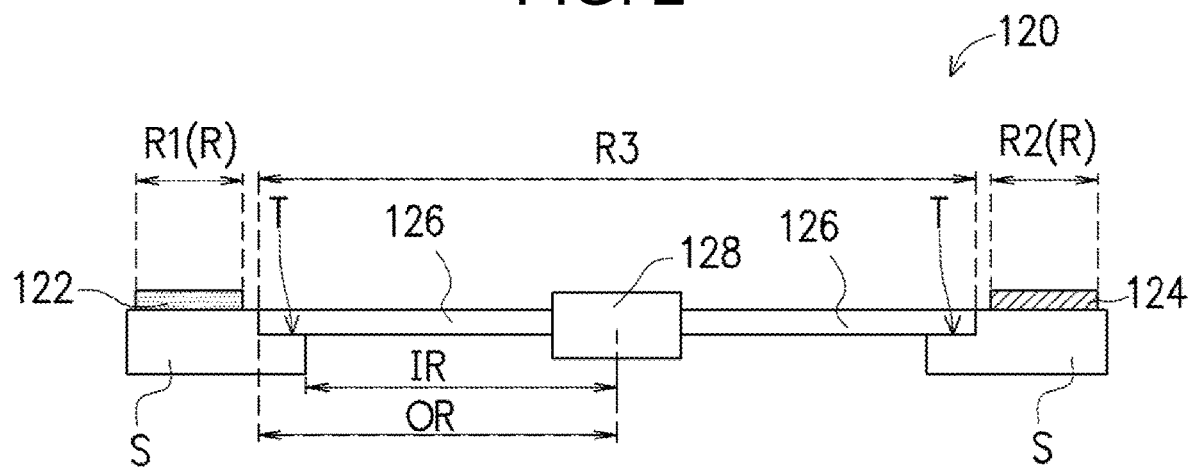
FIG. 3 is a schematic cross-sectional view of the wavelength conversion element in FIG. 1A and FIG. 1B.
Figure 4A:
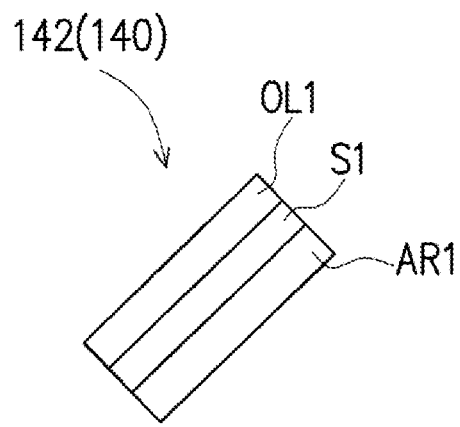
FIG. 4A is a schematic enlarged view of a first portion of a light splitting/combining optics group in FIG. 1A and FIG. 1B.
Figure 4B:
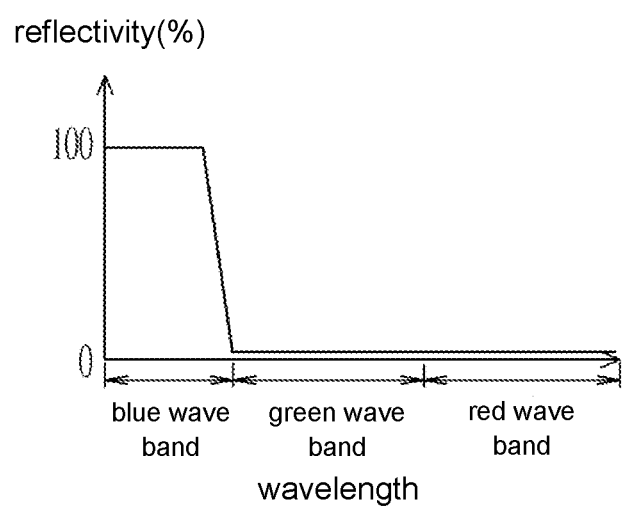
FIG. 4B is a spectrogram of an optical layer of the first portion.
Figure 5A:
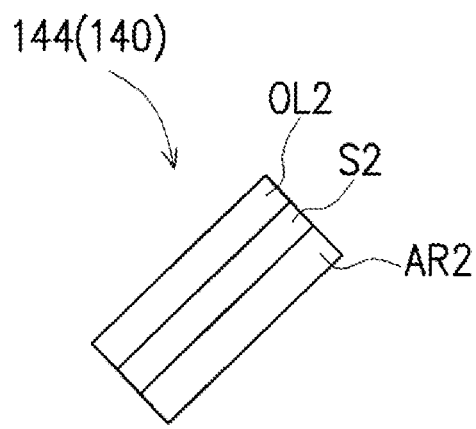
FIG. 5A is a schematic enlarged view of a second portion of the light splitting/combining optics group in FIG. 1A and FIG. 1B.
Figure 5B:
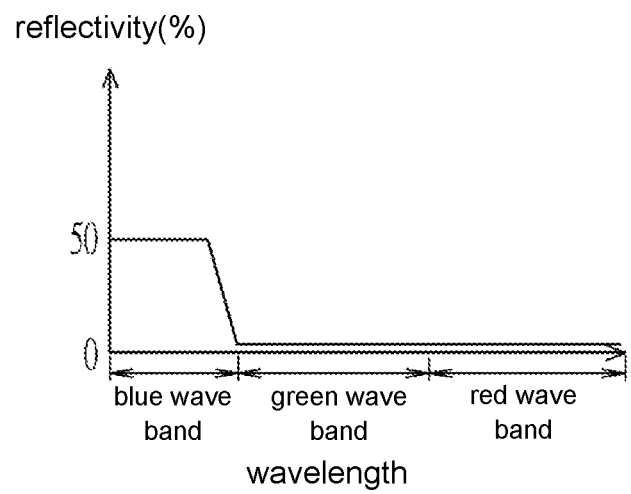
FIG. 5B is a spectrogram of an optical layer of the second portion.
Figure 6:
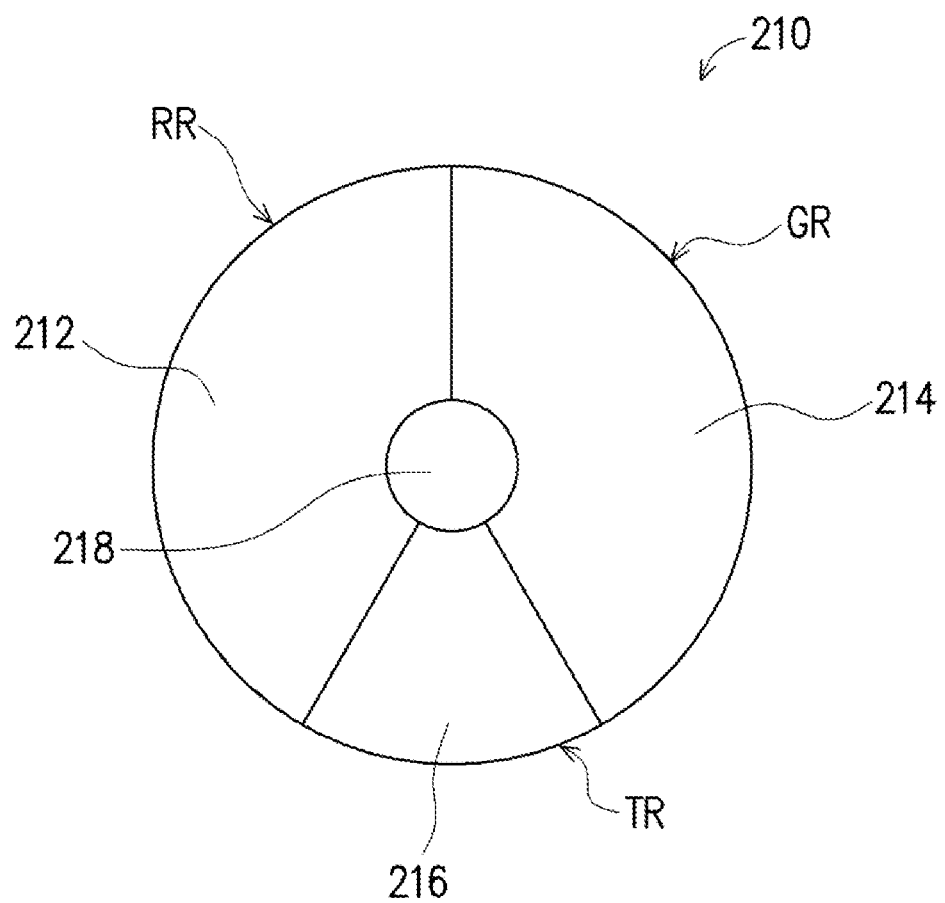
FIG. 6 is a schematic front view of a filter element in FIG. 1A and FIG. 1B.

FIG. 1A is a schematic diagram of a light path of a projection device during a first time period according to an embodiment of the disclosure. FIG. 1B is a schematic diagram of a light path of the projection device in FIG. 1A during a second time period. FIG. 2 is a schematic front view of a wavelength conversion element in FIG. 1A and FIG. 1B. FIG. 3 is a schematic cross-sectional view of the wavelength conversion element in FIG. 1A and FIG. 1B. FIG. 4A is a schematic enlarged view of a first portion of a light splitting/combining optics group in FIG. 1A and FIG. 1B. FIG. 4B is a spectrogram of an optical layer of the first portion. FIG. 5A is a schematic enlarged view of a second portion of the light splitting/combining optics group in FIG. 1A and FIG. 1B. FIG. 5B is a spectrogram of an optical layer of the second portion. FIG. 6 is a schematic front view of a filter element in FIG. 1A and FIG. 1B.

Referring to FIG. 1A and FIG. 1B, in this embodiment, a projection device 200 includes an illumination system 100, a filter element 210, a light uniformizing element 220, at least one light valve 230, and a projection lens 240. The illumination system 100 is configured to output a beam to the light valve 230. The illumination system 100 includes an excitation light source 110, a wavelength conversion element 120, a reflective cover 130, and a light splitting/combining optics group 140. The following paragraphs will describe in detail the aforementioned elements.

In the embodiments of the disclosure, the excitation light source 110 generally refers to a light source that is capable of emitting a short-wavelength beam, and a peak wavelength of the short-wavelength beam falls within the wavelength range of blue light or ultraviolet light, for example, wherein the peak wavelength is defined as the wavelength corresponding to the maximum light intensity, such as 445, 455, or 460 nm. The excitation light source 110 includes a laser diode (LD), a light emitting diode (LED), or a matrix composed of one of the foregoing. Nevertheless, the disclosure is not limited thereto. In this embodiment, the excitation light source 110 is a laser light emitting element. The excitation light source 110 provides an excitation beam EB.

In the embodiments of the disclosure, the wavelength conversion element 120 is an optical element configured to convert the short-wavelength beam into a long-wavelength beam with respect to the short-wavelength beam. In this embodiment, the wavelength conversion element 120 is a phosphor wheel, but not limited thereto. Referring to FIG. 2 and FIG. 3, specifically, the wavelength conversion element 120 has a wavelength conversion region R1, a reflective region R2, a light transmissive region R3, a rotation shaft 128, and an annular substrate S. The wavelength conversion region R1 and the reflective region R2 are arranged in an annular form around the rotation shaft 128 to form an annular region R. In addition, the wavelength conversion element 120 includes a wavelength conversion material 122, a reflective part 124, and a light transmissive part 126. The wavelength conversion material 122 defines the wavelength conversion region R1 and converts the short-wavelength beam transmitted to the wavelength conversion region R1 into a long-wavelength beam. The wavelength conversion material 122 is a phosphor, such as a yellow phosphor that may be excited to emit yellow light, but not limited thereto. When the excitation beam EB is transmitted to the wavelength conversion region R1, the excitation beam EB excites the wavelength conversion material 122 to emit a conversion beam CB. The conversion beam CB is a yellow beam, for example. The reflective part 124 defines the reflective region R2 and reflects the excitation beam transmitted to the reflective region R2, wherein the reflective part 124 may be a coating layer having a reflective function, but not limited thereto. The light transmissive part 126 defines the light transmissive region R3 and allows the beam transmitted to the light transmissive region R3 to pass through. The wavelength conversion region R1 and the reflective region R2 form the annular region R. The light transmissive region R3 is surrounded by the annular region R. The annular region R and the light transmissive region R3 are disposed around a common center CR, for example. Nevertheless, the disclosure is not limited thereto. The annular region R is correspondingly disposed on the annular substrate S, wherein the light transmissive part 126 is disposed between the annular substrate S and the rotation shaft 128. The light transmissive part 126 is located correspondingly in the light transmissive region R3. The light transmissive part 126 is respectively connected with the rotation shaft 128 and the annular substrate S. In this embodiment, the light transmissive part 126 is a transparent substrate, and an outer diameter (radius) OR of the transparent substrate is larger than an inner diameter IR of the annular substrate S. The transparent substrate abuts a trench T of the annular substrate S. In other embodiments, the outer diameter OR of the transparent substrate may be equal to the inner diameter IR of the annular substrate S, and the transparent substrate is attached to the annular substrate S via a colloid, for example. Nevertheless, the disclosure is not limited thereto. The annular substrate S is, for example, a metal substrate or a substrate having a highly reflective coating, and the annular substrate S is configured to reflect the conversion beam CB.

In the embodiments of the disclosure, the reflective cover 130 refers to a cover having a reflective function, which may be made of a metal material or formed by applying a highly reflective material (such as silver or a compound thereof) on a transparent substrate. In this embodiment, the reflective cover 130 has a parabolic reflective surface RS (disposed on the inner surface of the reflective cover 130), and the parabolic reflective surface RS has a focal point F. The reflective cover 130 includes a first reflective part 132 and a second reflective part 134 that are connected with each other. The first reflective part 132 is, for example, the upper half of the reflective cover 130. The second reflective part 134 is, for example, the lower half of the reflective cover 130. The first reflective part 132 is away from the wavelength conversion element 120 with respect to the second reflective part 134. An orthographic projection area of the second reflective part 134 on the wavelength conversion element 120 covers at least a part of the light transmissive region R3 of the wavelength conversion element 120.

In this embodiment, the light splitting/combining optics group 140 includes a first portion 142 and a second portion 144. Referring to FIG. 4A and FIG. 5A, specifically, the first portion 142 includes a first substrate S1, an optical layer OL1, and an anti-reflection coating (AR coating) AR1. The optical layer OL1 and the anti-reflection coating AR1 are respectively disposed on two opposite surfaces of the first substrate S1. The second portion 144 includes a second substrate S2, an optical layer OL2, and an anti-reflection coating AR2. The optical layer OL2 and the anti-reflection coating AR2 are respectively disposed on two opposite surfaces of the second substrate S2. Referring to FIG. 4B, the optical layer OL1 reflects a beam in the blue wavelength range and allows a beam in the green wavelength range and a beam in the red wavelength range to pass through. In this embodiment, the optical layer OL1 reflects blue light and allows green light and red light to pass through. Referring to FIG. 5B, the optical layer OL2 reflects a part of the beam in the blue wavelength range and allows the beam in the green wavelength range and the beam in the red wavelength range to pass through. In this embodiment, the optical layer OL2 reflects a part of blue light and allows a part of blue light, green light, and red light to pass through. The materials of the first substrate S and the second substrate S2 are both a light transmissive material, such as glass or plastic, but not limited thereto.

In the embodiments of the disclosure, the light valve 230 refers to any one of the following spatial light modulators, i.e., digital micro-mirror device (DMD), liquid-crystal-on-silicon panel (LCOS Panel), and liquid crystal panel (LCD). In this embodiment, the light valve 230 is a digital micromirror device. In this embodiment, one light valve 230 is provided. In other embodiments, more light valves 230 may be provided. Nevertheless, the disclosure is not limited thereto.

In the embodiments of the disclosure, the filter element 210 generally refers to an optical element that filters out a beam in a specific wavelength range and allows beams other than the beam in the specific wavelength range to pass through. Referring to FIG. 6, in this embodiment, the filter element 210 is a color wheel, for example. The filter element 210 has a red filter region RR, a green filter region GR, and a light transmissive region TR, and includes a red filter 212, a green filter 214, a light transmissive element (glass plate) 216, and a rotation shaft 218. The red filter 212 is disposed in the red filter region RR to allow a red beam to pass through and filter out beams other than the red beam. The green filter 214 is disposed in the green filter region GR to allow a green beam to pass through and filter out beams other than the green beam. For example, the red filter 212 is configured to allow the beam in the red wavelength range to pass through and filter out (or reflect) beams in other wavelength ranges, and so on. The light transmissive element 216 is disposed in the light transmissive region TR. In other embodiments, a diffuser, diffusion particles, or diffusion structures may also be disposed in the light transmissive region TR to reduce or eliminate speckles of the excitation beam. The red filter region RR occupies $5/12$ of the entire filter element 210, the green filter region GR occupies $5/12$ of the entire filter element 210, and the light transmissive region TR occupies $1/6$ of the entire filter element 210, for example. Nevertheless, the disclosure is not limited thereto, and those skilled in the art may make adjustments according to the design requirements.

In the embodiments of the disclosure, the light uniformizing element 220 refers to an optical element that uniformizes the beam passing through the light uniformizing element 220. In this embodiment, the light uniformizing element 220 is an integration rod, a lens array, or other optical elements having a light uniformizing effect, for example. Nevertheless, the disclosure is not limited thereto.

In the embodiments of the disclosure, the projection lens 240 is, for example, an optical lens or a combination of multiple optical lenses, which has a refracting power. The optical lens may include various combinations of non-planar lenses, such as biconcave lenses, biconvex lenses, concave convex lenses, convex concave lenses, plano-convex lenses, and plano-concave lenses. The disclosure is not intended to limit the projection lens 240 to certain forms or types. Moreover, in this embodiment, a converging lens C and a light guide group LA may be selectively disposed in the projection device 200 to adjust the path of the beam in the projection device 200.

The following paragraphs will describe in detail the relationship between the aforementioned elements. Referring to FIG. 1A and FIG. 1B again, the first portion 142 of the light splitting/combining optics group 140 is disposed on the transmission path of the excitation beam EB. The reflective cover 130 is disposed on the transmission path of the excitation beam EB from the first portion 142. The wavelength conversion element 120 is disposed on the transmission path of the excitation beam EB from the reflective cover 130. The second portion 144 of the light splitting/combining optics group 140 is disposed on the transmission path of the excitation beam EB or the conversion beam CB from the wavelength conversion element 120. The converging lens C is disposed on the transmission path of the excitation beam EB and the conversion beam CB from the light splitting/combining optics group 140 and located between the light splitting/combining optics group 144 and the filter element 210. The light uniformizing element 220 is disposed on the transmission path of the illumination beam IB from the filter element 210 and is located between the filter element 210 and at least one light valve 230. The light guide group LA is disposed on the transmission path of the illumination beam IB from the light uniformizing element 220. The light valve 230 is disposed on the transmission path of the illumination beam IB from the filter element 210. The projection lens 240 is disposed on the transmission path of the image beam IMB.

A driving element (such as a motor) of the wavelength conversion element 120 drives the rotation shaft 128 to rotate the wavelength conversion region R1 and the reflective region R2 sequentially into an irradiation region P. The focal point F of the parabolic reflective surface RS locates in the irradiation region P. In this embodiment, the projection device 200 rotates the wavelength conversion element 120 and the filter element 210 synchronously, such that the red filter region RR and the green filter region GR of the filter element 210 correspond to the wavelength conversion region R1 of the wavelength conversion element 120, and the light transmissive region TR of the filter element 210 corresponds to the reflective region R2 of the wavelength conversion element 120. In other words, the beam from the wavelength conversion region R1 passes through the red filter region RR or the green filter region GR, and the beam from the reflective region R2 passes through the light transmissive region TR. The following paragraphs will describe in detail the optical operation in the projection device 200.

Referring to FIG. 1A, the time period when the excitation beam EB is transmitted to the wavelength conversion region R1 in the annular region R is a first time period. During the first time period, the excitation beam EB is emitted by the excitation light source 110 and is sequentially guided to the wavelength conversion region R1 of the annular region R by the first portion 142 of the light splitting/combining optics group 140 and the first reflective part 132 of the reflective cover 130. Specifically, the excitation beam EB is reflected to the first reflective part 132 by the first portion 142. The excitation beam EB is then reflected by the first reflective part 132 to be transmitted to the irradiation region P that includes the focal point F of the parabolic reflective surface RS. In this embodiment, the irradiation region P is, for example, a region of a light spot of the excitation beam EB on the wavelength conversion region R1, and the longitudinal length of the light spot area is smaller than the width of the wavelength conversion region R1. The wavelength conversion region R1 is excited by the excitation beam EB to emit the conversion beam CB. The conversion beam CB is transmitted to the first reflective part 132 and the second reflective part 134 of the reflective cover 130 and is reflected by the first reflective part 132 and the second reflective part 134. Since the surfaces of the first reflective part 132 and the second reflective part 134 are the parabolic reflective surface RS, the conversion beam CB reflected by the first reflective part 132 and the second reflective part 134 exits the reflective cover 130 in a parallel manner. In addition, it is worth noting that a reference plane RP is disposed on the transmission path of the excitation beam EB between the first portion 142 of the light splitting/combining optics group 140 and the first reflective part 132 of the reflective cover 130, wherein the light spot area of the excitation beam EB on the reference plane RP is smaller than or equal to one half ($\frac{1}{2}$) of the orthographic projection area of the parabolic reflective surface RS of the reflective cover 130 on the reference plane RP.

Referring to FIG. 1A again, then, the reflected conversion beam CB is guided by the first portion 142 and the second portion 144 of the light splitting/combining optics group 140 to be transmitted in the direction D, such that the conversion beam CB is outputted from the illumination system 100. Specifically, the conversion beam CB is divided into a first conversion sub-beam CB1 and a second conversion sub-beam CB2 by the reflective cover 130. The first conversion sub-beam CB is reflected by the first reflective part 132 and passes through the first portion 142 of the light splitting/combining optics group 140 to be transmitted in the direction D. Furthermore, the second conversion sub-beam CB2 is reflected by the second reflective part 134 and passes through at least a part of the light transmissive region R3 of the wavelength conversion element 120 and passes through the second portion 144 of the light splitting/combining optics group 140 to be transmitted in the direction D. The conversion beam CB (the first conversion sub-beam CB1 and the second conversion sub-beam CB2) is converged on the red filter region RR or the green filter region GR of the filter element 140 by the converging lens C. Specifically, when the conversion beam CB is transmitted to the red filter region RR/the green filter region GR, the red filter region RR/the green filter region GR allows the red/green light in the conversion beam CB to pass through but filters out other color lights. In other words, the filter element 210 improves the color purity of the color light.

Referring to FIG. 1B, the time period when the excitation beam EB is transmitted to the reflective region R2 in the annular region R is a second time period. During the second time period, the excitation beam EB is emitted by the excitation light source 110 and is reflected to the first reflective part 132 of the reflective cover 130 by the first portion 142 of the light splitting/combining optics group 140. The excitation beam EB is reflected by the first reflective part 132 to be transmitted to the irradiation region P that includes the focal point F of the parabolic reflective surface RS. The excitation beam EB is further reflected by the reflective region R2 and transmitted to the second reflective part 134 of the reflective cover 130, and through reflection of the second reflective part 134, passes through at least a part of the light transmissive region R3. Likewise, the excitation beam EB exits the reflective cover 130 in a parallel manner.

Referring to FIG. 1B again, then, the reflected excitation beam EB is guided by the second portion 144 of the light splitting/combining optics group 140 to be transmitted in the direction D, such that the excitation beam EB is outputted from the illumination system 100. Specifically, the excitation beam EB is divided into a first excitation beam EB1 and a second excitation beam EB2 by the second portion 144. When the excitation beam EB is transmitted to the second portion 144, the optical layer 144b of the second portion 144 reflects half of the blue light and allows half of the blue light to pass through. Therefore, the first excitation beam EB1 is reflected by the second portion 144 and transmitted to the first portion 142, and the first excitation beam EB1 is reflected by the first portion 142 again to be transmitted in the direction D. Furthermore, the second excitation beam EB2 passes through the second portion 144 and is transmitted in the direction D. The first excitation beam EB1 and the second excitation beam EB2 are converged on the light transmissive region TR of the filter element 140 by the converging lens C. To further clarify, because of the light splitting function of the second portion 144 (part of the beam passes through while part of the beam is reflected), the excitation beam EB is uniformly transmitted to the converging lens C without causing a non-uniform distribution of the excitation beam EB.

Next, referring to FIG. 1A and FIG. 1B, the red filter region RR and the green filter region GR of the filter element 140 allow the red light/green light in the conversion beam CB to pass through. The light transmissive region TR of the filter element 140 allows the excitation beam EB to pass through, wherein the excitation beam EB is blue light, for example. The red light, green light, and blue light that pass through the filter element 140 according to the timings form the illumination beam IB. The illumination beam IB is transmitted to the light uniformizing element 220 for the light uniformizing element 220 to uniformize the illumination beam IB. The illumination beam IB is then guided to the light valve 230 by the light guide group LA, wherein the light guide group LA may be a TIR prism. The light valve 230 converts the illumination beam IB into the image beam IMB. The projection lens 240 then transmits the image beam IMB to a projection medium (e.g., a projection screen, not shown) to form an image.

As described above, in the illumination system 100 and the projection device 200 of the embodiment, since the orthographic projection area of the reflective cover 130 on the wavelength conversion element 120 covers at least a part of the light transmissive region R3, the conversion beam CB or the excitation beam EB reflected by the reflective cover 130 may exit via the light transmissive region R3 and be guided by the light splitting/combining optics group 140 to be transmitted in the same direction D. Therefore, in comparison with the related art, the illumination system 100 and the projection device 200 of the embodiment achieve the effect of guiding the excitation beam EB and the conversion beam CB in the same direction D with fewer optical elements and a smaller size.

Furthermore, in the illumination system 100 and the projection device 200 of the embodiment, the excitation beam EB or the conversion beam CB is reflected to the light splitting/combining optics group 140 by the reflective surface RS of the reflective cover 130. The illumination system 100 and the projection device 200 of the embodiment are less likely to have beam scattering and thus achieve favorable optical efficiency.

It should be noted that some descriptions provided in the previous embodiments also apply to the following embodiments and thus are not repeated hereinafter. Details of elements with the same names have been specified in the previous embodiments and thus repetitive descriptions are omitted.

Figure 7A:
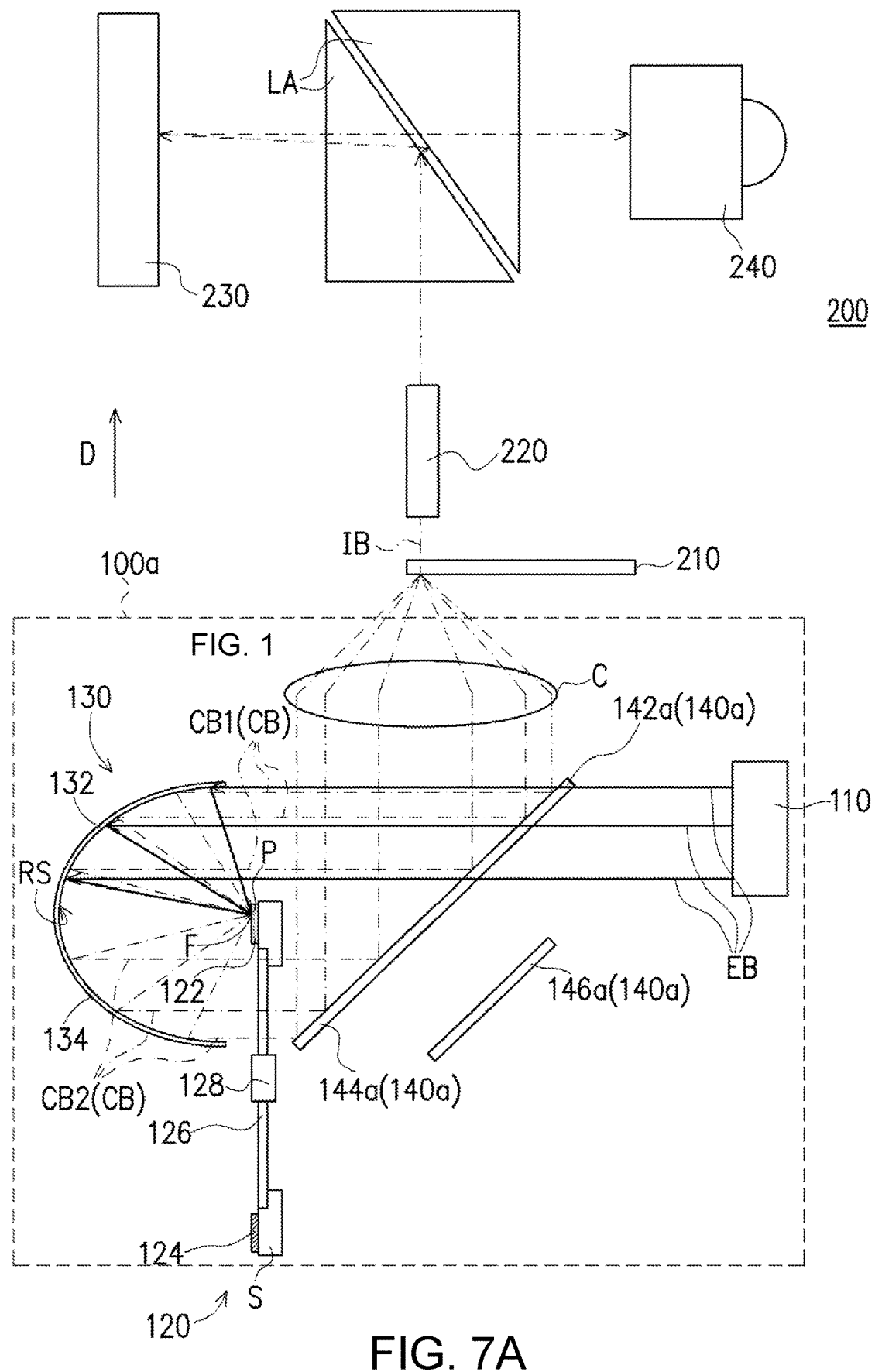
FIG. 7A is a schematic diagram of a light path of an illumination system 100a during a first time period according to another embodiment of the disclosure.
Figure 7B:
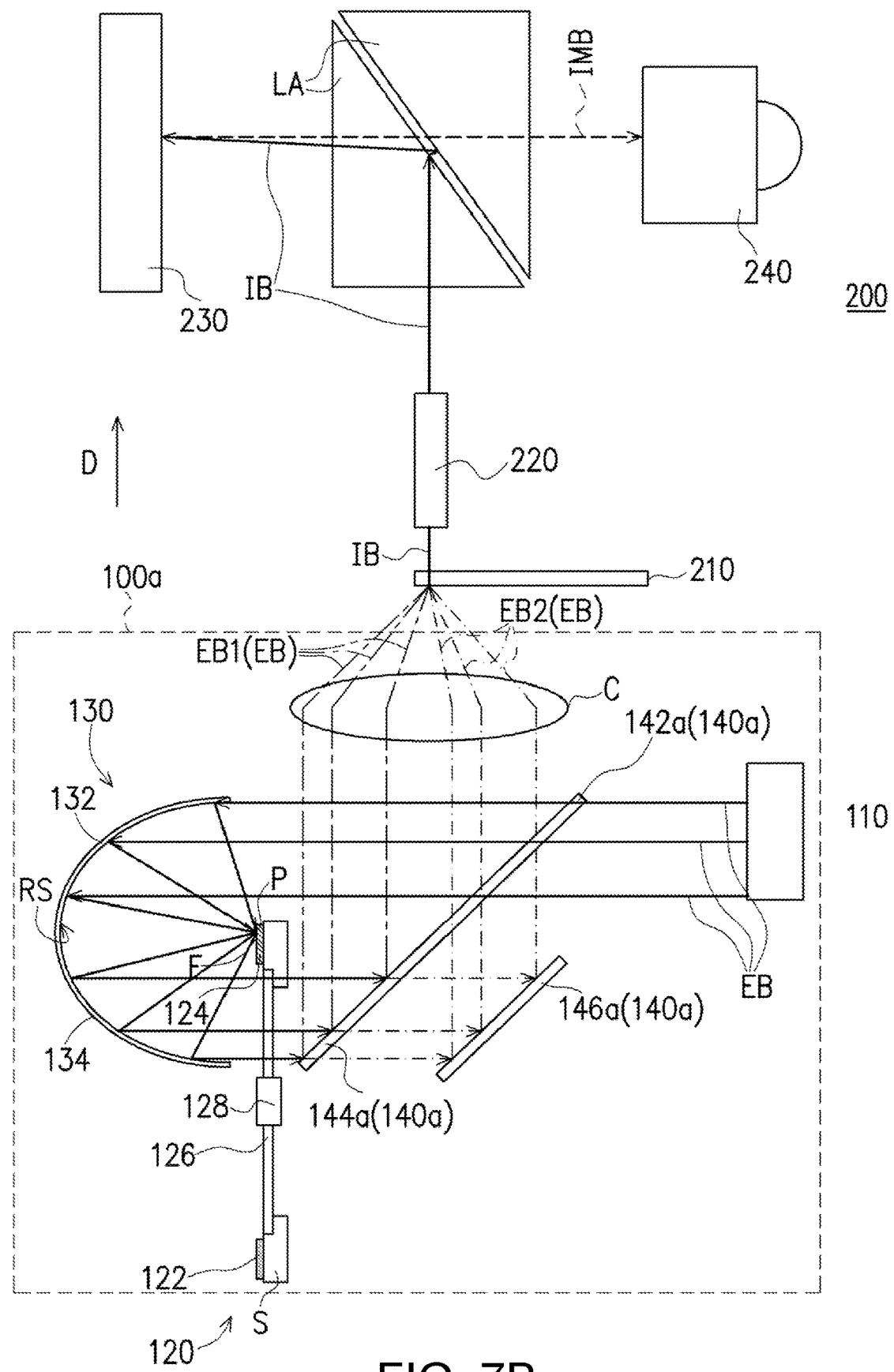
FIG. 7B is a schematic diagram of a light path of the illumination system 100a in FIG. 7A during a second time period.
Figure 8A:
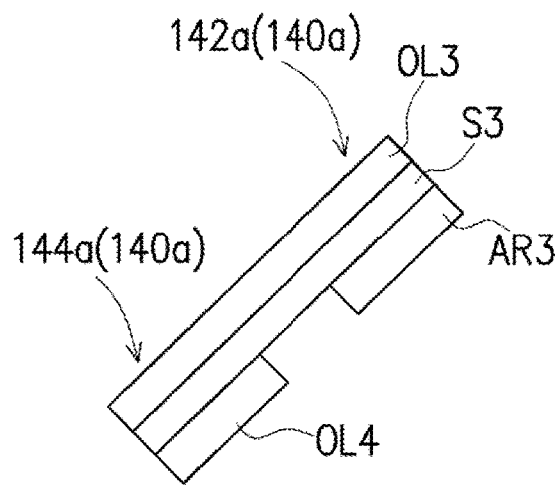
FIG. 8A is a schematic enlarged view of a first portion and a second portion of a light splitting/combining optics group in FIG. 7A and FIG. 7B.
Figure 8B:
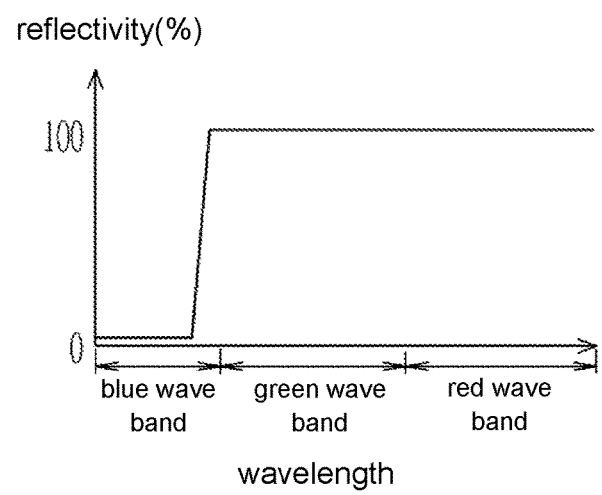
FIG. 8B is a spectrogram of an optical layer shared by the first portion and the second portion.
Figure 8C:
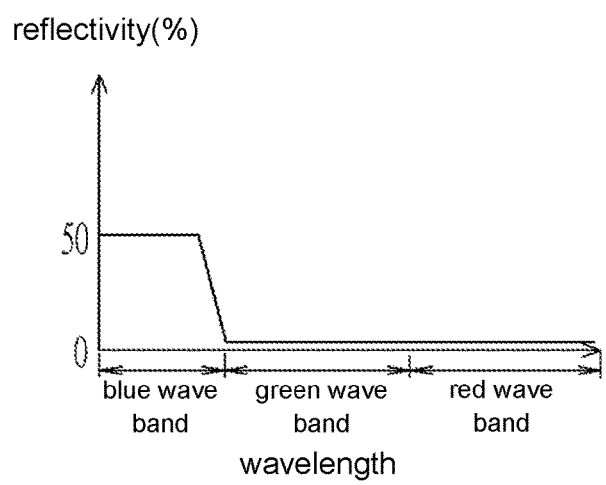
FIG. 8C is a spectrogram of the optical layer of the second portion.

FIG. 7A is a schematic diagram of a light path of an illumination system 100a during a first time period according to another embodiment of the disclosure. FIG. 7B is a schematic diagram of a light path of the illumination system 100a in FIG. 7A during a second time period. FIG. 8A is a schematic enlarged view of a first portion and a second portion of a light splitting/combining optics group in FIG. 7A and FIG. 7B. FIG. 8B is a spectrogram of an optical layer shared by the first portion and the second portion. FIG. 8C is a spectrogram of the optical layer of the second portion. FIG. 9A is a schematic enlarged view of a third portion. FIG. 9B is a spectrogram of an optical layer in FIG. 9A.

Referring to the illumination system 100a in FIG. 7A and FIG. 7B and FIG. 8A, FIG. 8B, FIG. 8C, FIG. 9A, and FIG. 9B, the illumination system 100a is similar to the illumination system 100 in FIG. 1A and FIG. 1B, and a main difference in architecture between the illumination system 100a and the illumination system 100 is that: in addition to the first portion 142a and the second portion 144a, the light splitting/combining optics group 140a further includes a third portion 146a. The third portion 146a is disposed on the transmission path of the excitation beam EB. Referring to FIG. 8A, FIG. 8B, and FIG. 8C, in this embodiment, the first portion 142a of the light splitting/combining optics group 140a and the second portion 144a of the light splitting/combining optics group 140a are disposed on the same substrate S3, for example. The first portion 142a and the second portion 144a share the same optical layer OL3, and are disposed on a surface of the substrate S3. An optical layer OL4 and an anti-reflection coating AR3 are disposed on the other surface of the substrate S3. The anti-reflection coating AR3 and the optical layer OL4 respectively define the areas of the first portion 142a and the second portion 144a on the substrate S3. Referring to FIG. 8B, in this embodiment, the optical layer OL3 allows the beam in the blue wavelength range to pass through and reflects the beams in the green wavelength range and the red wavelength range. The optical layer OL3 allows blue light to pass through and reflects green light and red light (that is, reflects the beam in the yellow wavelength range). Referring to FIG. 8C, in this embodiment, the optical layer OL4 reflects a part of the beam in the blue wavelength range and allows a part of the beam in the blue wavelength range to pass through, and reflects the beams in the green wavelength range and the red wavelength range. The optical layer OL4 reflects a part of the blue light and allows a part of the blue light, green light, and red light to pass through (that is, allows the beam in the yellow wavelength range to pass through).

Referring to FIG. 9A and FIG. 9B, the third portion 146a of the light splitting/combining optics group 140a includes a substrate S4 and an optical layer OL5, and the optical layer OL5 is disposed on a surface of the substrate S4. The optical layer OL5 reflects the beam in the blue wavelength range. The optical layer OL5 reflects blue light and allows the beams in the red wavelength range and the green wavelength range to pass through. In other embodiments, the optical layer OL5 may be a high-reflectivity reflective layer, which is formed by coating a silver or aluminum substrate with silica or magnesium fluoride. Next, the optical operation of the illumination system 100a will be described in the following paragraphs.

Referring to FIG. 7A, during the first time period, the excitation beam EB first passes through the first portion 142a and is reflected by the first reflective part 132 of the reflective cover 130 to be transmitted to the wavelength conversion region R1 of the annular region R, so as to excite the wavelength conversion region R1 to emit the conversion beam CB. The first conversion sub-beam CB1 in the conversion beam CB is reflected by the first reflective part 132 and exits the reflective cover 130 in parallel. The first conversion sub-beam CB1 is then reflected by the first portion 142a to be transmitted in the direction D. In addition, the second conversion sub-beam CB2 in the conversion beam CB is reflected by the second reflective part 134 and passes through at least a part of the light transmissive region R3. The second conversion sub-beam CB2 is then reflected by the second portion 144a to be transmitted in the direction D and be converged on the filter element 210 by the converging lens C. The subsequent optical operation regarding the conversion beam CB is similar to the optical operation in FIG. 1A and thus details are not repeated hereinafter.

Referring to FIG. 7B, during the second time period, after the excitation beam EB passes through the first portion 142a, the excitation beam EB is reflected by the first reflective part 132 of the reflective cover 130 and transmitted to the reflective region R2 of the annular region R. After being reflected by the reflective region R2, the excitation beam EB is reflected by the second reflective part 134 of the reflective cover 130 and passes through at least a part of the light transmissive region T3. The excitation beam EB is then guided by the second portion 144a to be transmitted in the direction D. Specifically, the first excitation sub-beam EB1 in the excitation beam EB is reflected by the second portion 144a and transmitted in the direction D. The second excitation sub-beam EB2 in the excitation beam EB passes through the second portion 144a and is then reflected by the third portion 146a to be transmitted to the first portion 142a. The second excitation sub-beam EB2 then passes through the first portion 142a to be transmitted in the direction D and converged on the filter element 210 by the converging lens C. The subsequent optical operation regarding the excitation beam EB is similar to the optical operation in FIG. 1B and thus details are not repeated hereinafter.

Figure 13A:
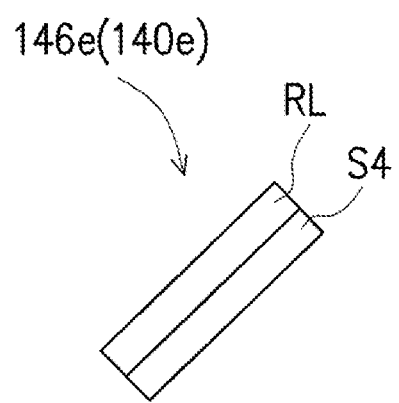
FIG. 13A is a schematic enlarged view of a third portion according to another embodiment of the disclosure.
Figure 13B:
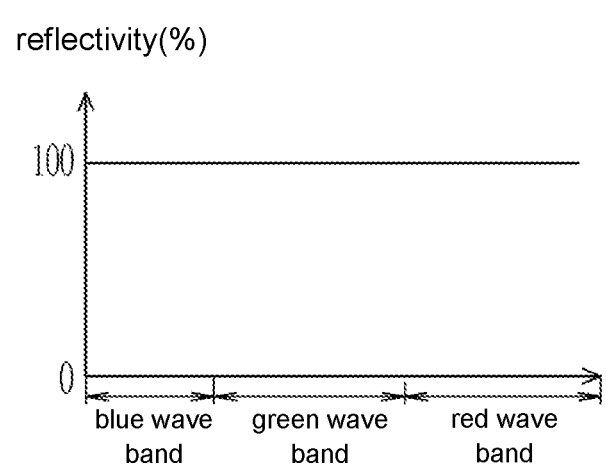
FIG. 13B is a spectrogram of a reflective film of the third portion in FIG. 13A.

FIG. 10, FIG. 11A, and FIG. 12 are schematic enlarged views of the first portion and the second portion according to different embodiments of the disclosure. FIG. 11B is a spectrogram of an optical layer of the second portion in FIG. 11A. FIG. 13A is a schematic enlarged view of a third portion according to another embodiment of the disclosure. FIG. 13B is a spectrogram of a reflective film of the third portion in FIG. 13A.

Referring to FIG. 10, the first portion 142b and the second portion 144b of the light splitting/combining optics group 140b are similar to the first portion 142a and the second portion 144a in FIG. 8A, and a main difference is that: the first portion 142b and the second portion 144b are separated from each other. It should be noted that the first portion 142b and the second portion 144b described above may replace the first portion 142a and the second portion 144a in FIG. 7A and FIG. 7B to achieve the same optical effect.

Referring to FIG. 11A and FIG. 11B, the first portion 142c and the second portion 144c of the light splitting/combining optics group 140c are similar to the first portion 142a and the second portion 144a in FIG. 8A, and a main difference is that: the first portion 142c and the second portion 144c share the anti-reflection coating AR3. The optical layer OL3 and an optical layer OL6 respectively define the first portion 142c and the second portion 144c. Referring to FIG. 11B, the optical layer OL6 reflects a part of the beam in the blue wavelength range and allows a part of the beam in the blue wavelength range to pass through, and reflects the beam in the red wavelength range and the beam in the green wavelength range. The optical layer OL6 reflects a part of the blue light, green light, and red light (that is, reflects the beam in the yellow wavelength range) and allows a part of the blue light to pass through. It should be noted that the first portion 142c and the second portion 144c described above may replace the first portion 142a and the second portion 144a in FIG. 7A and FIG. 7B to achieve the same optical effect.

Referring to FIG. 12, the first portion 142d and the second portion 144d are similar to the first portion 142c and the second portion 144c in FIG. 11A, and a main difference is that: the first portion 142d and the second portion 144d are separated from each other. It should be noted that the first portion 142d and the second portion 144d described above may replace the first portion 142a and the second portion 144a in FIG. 7A and FIG. 7B to achieve the same optical effect.

Referring to FIG. 13A and FIG. 13B, a third portion 146e is similar to the third portion 146 in FIG. 9A and FIG. 9B, and a main difference is that: a reflective layer RL is disposed on a surface of the third substrate S3. The reflective layer RL reflects blue light, and may be formed by coating a silver or aluminum substrate with silica or magnesium fluoride. It should be noted that the third portion 146e described above may replace the third portion 146 in FIG. 7A and FIG. 7B to achieve the same optical effect.

Figure 14:
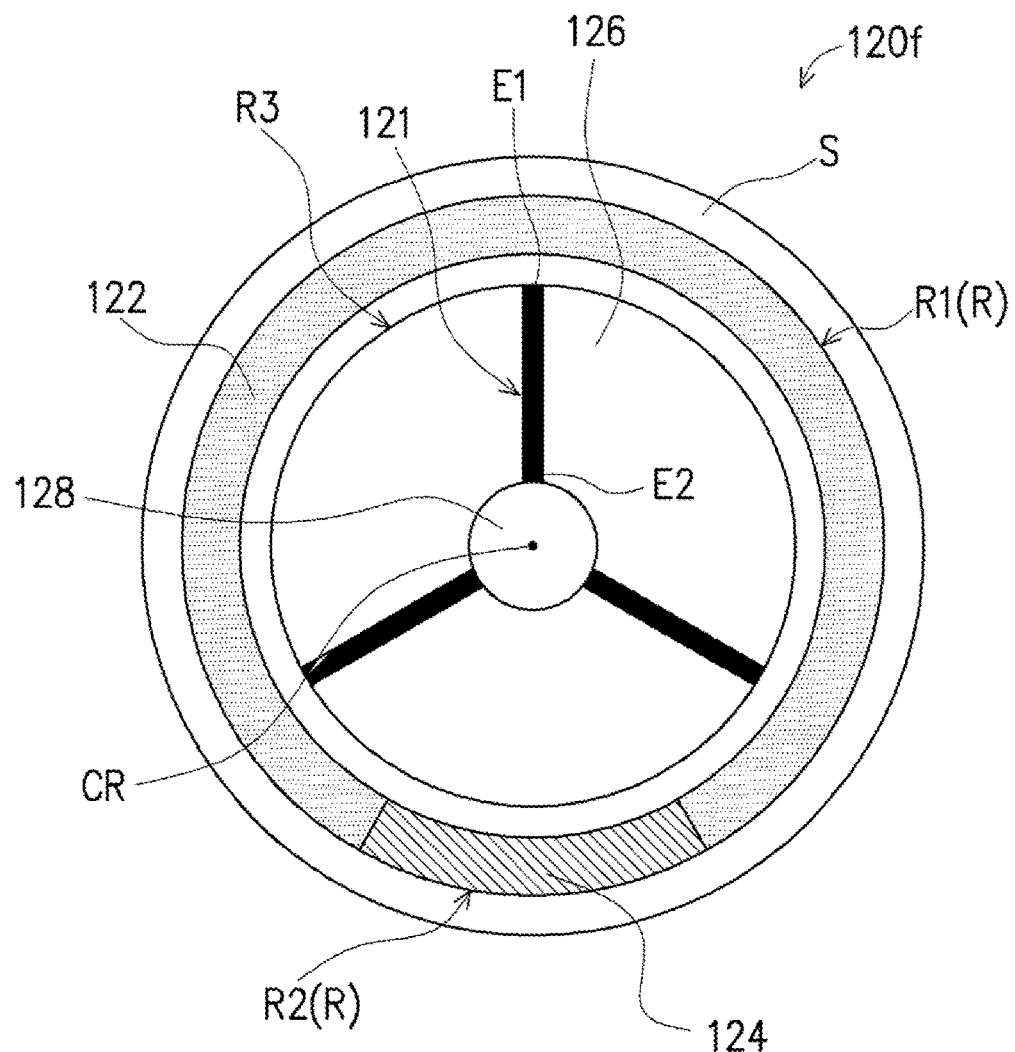
FIG. 14 illustrates a wavelength conversion element according to another embodiment of the disclosure.
Figure 15:
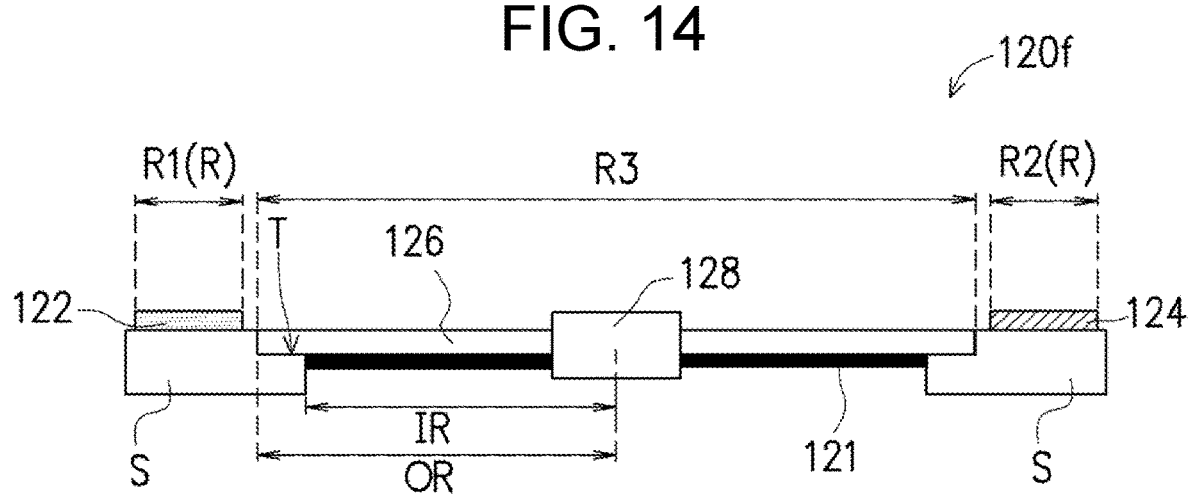
FIG. 15 is a schematic cross-sectional view of the wavelength conversion element in FIG. 14.

FIG. 14 illustrates a wavelength conversion element according to another embodiment of the disclosure. FIG. 15 is a schematic cross-sectional view of the wavelength conversion element in FIG. 14.

Referring to FIG. 14 and FIG. 15, in this embodiment, the wavelength conversion element 120f further includes a plurality of support parts 121. Each support part 121 has two ends E1 and E2, and one end E2 of each support part 121 is connected with the rotation shaft 128. The other end E1 of each support part 121 is connected with the annular substrate S. In this embodiment, three support parts 121 may divide the light transmissive region R3 into three regions, and the three regions are fan-shaped and have equal areas (the angle between two support parts 121 is 120 degrees). Therefore, by disposing these support parts 121, the wavelength conversion element 120f of this embodiment has higher structural strength than the wavelength conversion element 120.

Figure 16:
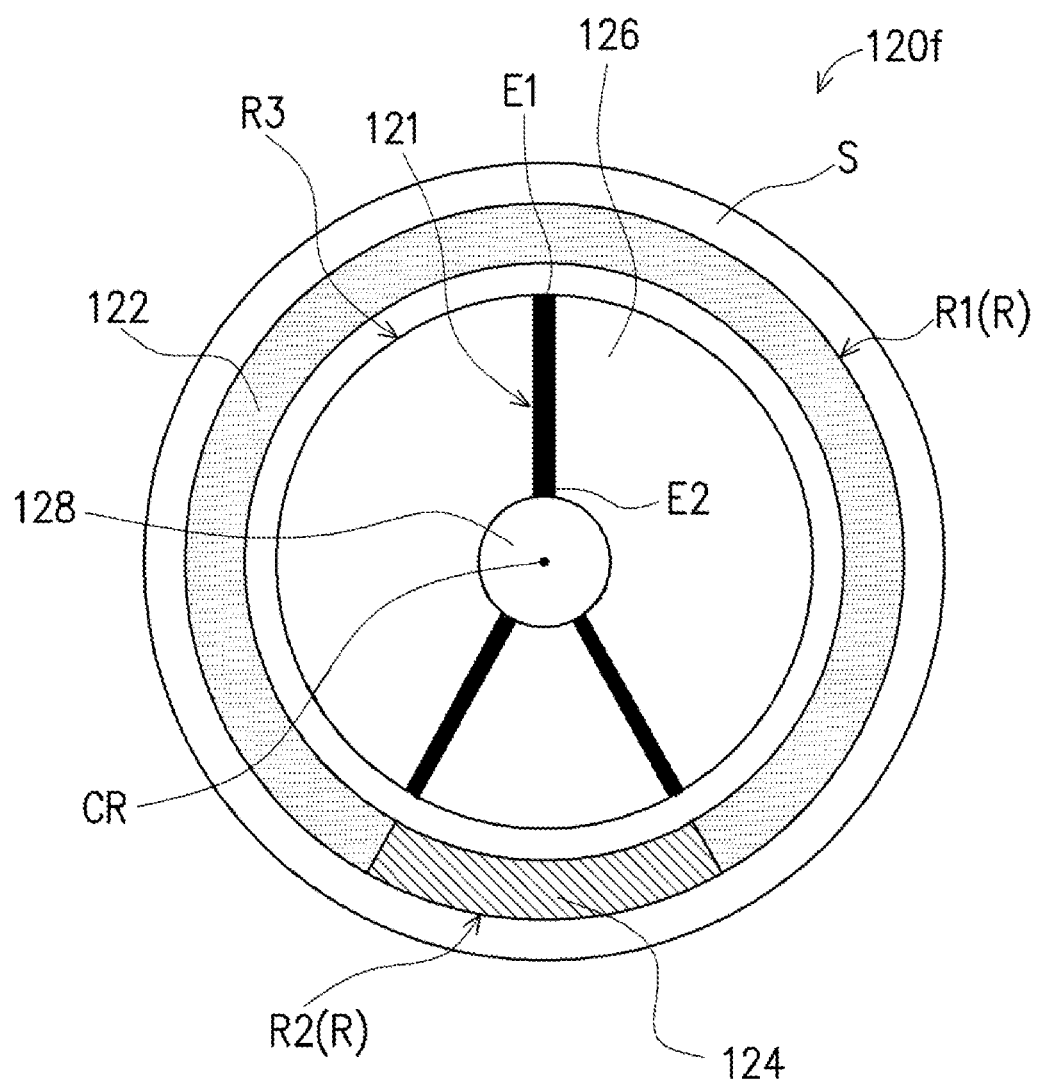
FIG. 16 illustrates a wavelength conversion element according to yet another embodiment of the disclosure.

In addition, FIG. 16 illustrates a wavelength conversion element according to yet another embodiment of the disclosure. Referring to FIG. 6 and FIG. 16, in this embodiment, the support parts 121 are disposed corresponding to the spacings respectively between the red filter region RR, the green filter region GR, and the light transmissive region TR of the filter element 210. When the conversion beam CB or the excitation beam EB passes through the light transmissive region R3, a part of the conversion beam CB or a part of the excitation beam EB is blocked by the support parts 121 and is not transmitted to the spacings respectively between the three regions of the filter element 210. Such a configuration prevents color light scattering that may occur if the conversion beam CB reaches the spacings respectively between the three regions. In addition, loss of the excitation beam EB or the conversion beam CB may also be reduced by the characteristics of the spoke region in the filter element 210. Due to the spacings respectively between the red filter region RR, the green filter region GR, and the light transmissive region TR of the filter element 210, the beams passing through the filter regions in these spacings may generate unexpected colors (not pure colors). Since the light valve 230 is usually closed during the time period corresponding to the spacing, the design of the positions of the support parts 121 does not affect the quality or color of the projected image. It should be noted that the wavelength conversion element 120f described above may replace the wavelength conversion elements 120 in the illumination system 100 and the illumination system 100a.

To sum up, in the illumination system and the projection device of the embodiments of the disclosure, since the reflective cover covers at least a part of the light transmissive region, the conversion beam or the excitation beam reflected by the reflective cover may exit via the light transmissive region and be guided by the light splitting/combining optics group to be transmitted in the same direction. Therefore, in comparison with the related art, the illumination system and the projection device of the embodiments of the disclosure achieve the effect of guiding the excitation beam and the conversion beam in the same direction with fewer optical elements and a smaller size. In addition, since the reflective surface of the reflective cover is not composed of the surface of the light splitting/combining element, the illumination system and the projection device of the embodiment of the disclosure are less likely to have beam scattering and thus achieve favorable optical efficiency.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An illumination system, comprising an excitation light source and a wavelength conversion element, wherein
   the excitation light source provides an excitation beam, and
   the wavelength conversion element comprises a wavelength conversion region, a reflective region, and a light transmissive region, wherein the wavelength conversion region and the reflective region form an annular region, and the light transmissive region is surrounded by the annular region, wherein the excitation beam passes through the light transmissive region of the wavelength conversion element.

2. The illumination system according to claim 1, further comprising a reflective cover, wherein the reflective cover has a focal point, the wavelength conversion region and the reflective region of the wavelength conversion element sequentially enter an irradiation region, the focal point locates in the irradiation region, and an orthographic projection area of the reflective cover on the wavelength conversion element covers at least a part of the light transmissive region of the wavelength conversion element.

3. The illumination system according to claim 2, further comprising a light splitting/combining optics group, wherein the light splitting/combining optics group comprises a first portion and a second portion, the first portion and the second portion being are disposed on a transmission path of the excitation beam, wherein the excitation beam is sequentially guided to the reflective cover by the first portion and then guided to the annular region by the reflective cover.

4. The illumination system according to claim 3, wherein a reference plane is disposed between the light splitting/combining optics group and the reflective cover and located on the transmission path of the excitation beam, wherein a light spot area of the excitation beam on the reference plane is smaller than or equal to ½ of an orthographic projection area of the reflective cover on the reference plane.

5. The illumination system according to claim 3, wherein the reflective cover comprises a first reflective part and a second reflective part, the first reflective part is away from the wavelength conversion element with respect to the second reflective part, and an orthographic projection area of the second reflective part on the wavelength conversion element covers at least a part of the light transmissive region of the wavelength conversion element.

6. The illumination system according to claim 2, wherein the reflective cover has a parabolic reflective surface, and the excitation beam is reflected by the parabolic reflective surface of the reflective cover.

7. The illumination system according to claim 1, wherein the wavelength conversion element comprises a rotation shaft, an annular substrate, and a light transmissive part, wherein the annular region is correspondingly located on the annular substrate, the light transmissive part and the rotation shaft are correspondingly located in the light transmissive region, and the light transmissive part is respectively connected with the rotation shaft and the annular substrate.

8. The illumination system according to claim 7, wherein the light transmissive part is a transparent substrate, and an outer diameter of the transparent substrate is larger than or equal to an inner diameter of the annular substrate.

9. The illumination system according to claim 7, wherein the wavelength conversion element further comprises a plurality of support parts, and one end of each of the support parts is connected with the rotation shaft and the other end of each of the support parts is connected with the annular substrate.

10. The illumination system according to claim 1, wherein the annular region and the light transmissive region of the wavelength conversion element are disposed around a common center in arrangement.

11. The illumination system according to claim 5, wherein:
during a time period when the excitation beam is transmitted to the wavelength conversion region in the annular region, the wavelength conversion region is excited by the excitation beam to emit a conversion beam, the conversion beam is reflected by the reflective cover, and a part of the conversion beam passes through at least a part of the light transmissive region and is guided by the first portion and the second portion of the light splitting/combining optics group to be transmitted in a direction, so as to output the conversion beam, and
during a time period when the excitation beam is transmitted to the reflective region in the annular region, the excitation beam is sequentially reflected by the reflective region and the reflective cover to pass through at least a part of the light transmissive region and be guided by the second portion of the light splitting/combining optics group to be transmitted in the direction, so as to output the excitation beam.

12. The illumination system according to claim 11, wherein:
the excitation beam is sequentially reflected by the first portion and the first reflective part of the reflective cover and is transmitted to the annular region, wherein
during the time period when the excitation beam is transmitted to the wavelength conversion region in the annular region, a first conversion sub-beam in the conversion beam is reflected by the first reflective part and passes through the first portion to be guided and transmitted in the direction, and a second conversion sub-beam in the conversion beam is reflected by the second reflective part and passes through at least a part of the light transmissive region and the second portion to be transmitted in the direction, and
during the time period when the excitation beam is transmitted to the reflective region in the annular region, the excitation beam is reflected by the second reflective part and passes through at least a part of the light transmissive region and is guided by the first portion and the second portion to be transmitted in the direction.

13. The illumination system according to claim 5, wherein:
the excitation beam passes through the first portion and is reflected by the first reflective part of the reflective cover to be transmitted to the annular region, wherein
during a time period when the excitation beam is transmitted to the wavelength conversion region in the annular region, a first conversion sub-beam in the conversion beam is reflected by the first reflective part and reflected by the first portion to be transmitted in a direction, and a second conversion sub-beam in the conversion beam is reflected by the second reflective part and passes through at least a part of the light transmissive region and is reflected by the second portion to be transmitted in the direction, and
during a time period when the excitation beam is transmitted to the reflective region in the annular region, the excitation beam is reflected by the second reflective part and passes through at least a part of the light transmissive region to be guided by the second portion to be transmitted in the direction.

14. The illumination system according to claim 13, wherein the light splitting/combining optics group further comprises a third portion disposed on the transmission path of the excitation beam, wherein during the time period when the excitation beam is transmitted to the reflective region in the annular region, a first excitation sub-beam in the excitation beam is reflected by the second portion to be transmitted in the direction, and a second excitation sub-beam in the excitation beam passes through the second portion and is reflected by the third portion to be transmitted in the direction.

15. A projection device, comprising an illumination system, a filter element, at least one light valve, and a projection lens, wherein:
the illumination system comprises an excitation light source and a wavelength conversion element,
the excitation light source provides an excitation beam,
the wavelength conversion element comprises a wavelength conversion region, a reflective region, and a light transmissive region, wherein the wavelength conversion region and the reflective region form an annular region, and the light transmissive region is surrounded by the annular region, wherein the excitation beam passes through the light transmissive region of the wavelength conversion element,
the filter element is disposed on a transmission path of the excitation beam from the illumination system to form an illumination beam,
the at least one light valve is disposed on a transmission path of the illumination beam from the filter element to convert the illumination beam into an image beam, and
the projection lens is disposed on a transmission path of the image beam.

16. The projection device according to claim 15, further comprising a reflective cover, wherein the reflective cover has a focal point, wherein the wavelength conversion region and the reflective region of the wavelength conversion element sequentially enter an irradiation region, the focal point locates in the irradiation region, and an orthographic projection area of the reflective cover on the wavelength conversion element covers at least a part of the light transmissive region of the wavelength conversion element.

17. The projection device according to claim 16, further comprising a light splitting/combining optics group that comprises a first portion and a second portion disposed on the transmission path of the excitation beam, wherein the excitation beam is sequentially guided by the first portion and the reflective cover to be transmitted to the annular region.

18. The projection device according to claim 17, wherein a reference plane is disposed between the light splitting/combining optics group and the reflective cover and located on the transmission path of the excitation beam, wherein a light spot area of the excitation beam on the reference plane is smaller than or equal to ½ of an orthographic projection area of the reflective cover on the reference plane.

19. The projection device according to claim 17, wherein the reflective cover comprises a first reflective part and a second reflective part, the first reflective part is away from the wavelength conversion element with respect to the second reflective part, and an orthographic projection area of the second reflective part on the wavelength conversion element covers at least a part of the light transmissive region of the wavelength conversion element.

20. The projection device according to claim 16, wherein the reflective cover has a parabolic reflective surface, and the excitation beam is reflected by the parabolic reflective surface of the reflective cover.

21. The projection device according to claim 15, wherein the wavelength conversion element comprises a rotation shaft, an annular substrate, and a light transmissive part, wherein the annular region is correspondingly located on the annular substrate, the light transmissive part and the rotation shaft are correspondingly located in the light transmissive region, and the light transmissive part is respectively connected with the rotation shaft and the annular substrate.

22. The projection device according to claim 21, wherein the light transmissive part is a transparent substrate, and an outer diameter of the transparent substrate is larger than or equal to an inner diameter of the annular substrate.

23. The projection device according to claim 21, wherein the wavelength conversion element further comprises a plurality of support parts, and one end of each of the support parts is connected with the rotation shaft and the other end of each of the support parts is connected with the annular substrate.

24. The projection device according to claim 15, wherein the annular region and the light transmissive region in the wavelength conversion element are disposed around a common center.

25. The projection device according to claim 19, wherein:
during a time period when the excitation beam is transmitted to the wavelength conversion region in the annular region, the wavelength conversion region is excited by the excitation beam to emit the conversion beam, the conversion beam is reflected by the reflective cover, and a part of the conversion beam passes through at least a part of the light transmissive region and is guided by the first portion and the second portion of the light splitting/combining optics group to be transmitted in a direction, so as to output the conversion beam, and
during a time period when the excitation beam is transmitted to the reflective region in the annular region, the excitation beam is sequentially reflected by the reflective region and the reflective cover to pass through at least a part of the light transmissive region and be guided by the second portion of the light splitting/combining optics group to be transmitted in the direction, so as to output the excitation beam.

26. The projection device according to claim 25, wherein:
the excitation beam is sequentially reflected by the first portion and the first reflective part of the reflective cover and is transmitted to the annular region, wherein
during the time period when the excitation beam is transmitted to the wavelength conversion region in the annular region, a first conversion sub-beam in the conversion beam is reflected by the first reflective part and passes through the first portion to be guided and transmitted in the direction, and a second conversion sub-beam in the conversion beam is reflected by the second reflective part and passes through at least a part of the light transmissive region and the second portion to be transmitted in the direction, and during the time period when the excitation beam is transmitted to the reflective region in the annular region, the excitation beam is reflected by the second reflective part and passes through at least a part of the light transmissive region and is guided by the first portion and the second portion to be transmitted in the direction.

27. The projection device according to claim 19, wherein:

the excitation beam passes through the first portion and is reflected by the first reflective part of the reflective cover to be transmitted to the annular region, wherein during a time period when the excitation beam is transmitted to the wavelength conversion region in the annular region, a first conversion sub-beam in the conversion beam is reflected by the first reflective part and reflected by the first portion to be transmitted in a direction, and a second conversion sub-beam in the conversion beam is reflected by the second reflective part and passes through at least a part of the light transmissive region and is reflected by the second portion to be transmitted in the direction, and during a time period when the excitation beam is transmitted to the reflective region in the annular region, the excitation beam is reflected by the second reflective part and passes through at least a part of the light transmissive region to be guided by the second portion to be transmitted in the direction.

28. The projection device according to claim 27, wherein the light splitting/combining optics group further comprises a third portion disposed on the transmission path of the excitation beam, wherein during the time period when the excitation beam is transmitted to the reflective region in the annular region, a first excitation sub-beam in the excitation beam is reflected by the second portion to be transmitted in the direction, and a second excitation sub-beam in the excitation beam passes through the second portion and is reflected by the third portion to be transmitted in the direction.

29. The projection device according to claim 15, further comprising a light uniformizing element disposed on the transmission path of the illumination beam from the filter element and located between the filter element and the at least one light valve.

* * * * *